United States Patent
Abu-Rahma et al.

(10) Patent No.: US 9,786,357 B2
(45) Date of Patent: Oct. 10, 2017

(54) BIT-CELL VOLTAGE DISTRIBUTION SYSTEM

(71) Applicant: Apple Inc., Cupertino, CA (US)

(72) Inventors: Mohamed H. Abu-Rahma, Mountain View, CA (US); Yildiz Sinangil, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/046,329

(22) Filed: Feb. 17, 2016

(65) Prior Publication Data

US 2017/0236577 A1 Aug. 17, 2017

(51) Int. Cl.
G11C 11/00 (2006.01)
G11C 11/418 (2006.01)
G11C 8/08 (2006.01)

(52) U.S. Cl.
CPC .............. *G11C 11/418* (2013.01); *G11C 8/08* (2013.01)

(58) Field of Classification Search
CPC ................................ G11C 11/418; G11C 8/08
USPC ................ 365/154, 156, 226, 227, 228, 229
See application file for complete search history.

(56) References Cited

U.S. PATENT DOCUMENTS

| 5,046,052 A * | 9/1991 | Miyaji .................. G11C 5/143 365/189.09 |
| 7,158,404 B2 | 1/2007 | Lai |
| 7,817,455 B2 | 10/2010 | Fredeman et al. |
| 9,001,569 B1 | 4/2015 | Jain et al. |
| 2005/0226077 A1* | 10/2005 | Itoh ....................... G11C 11/412 365/226 |

OTHER PUBLICATIONS

Daeyeon Kim, et al., "Variation-Aware Static and Dynamic Writability Analysis for Voltage-Scaled Bit-Interleaved 8-T SRAMsm," International Symposium on Low Power Electronics and Design (ISLPED), Aug. 1-3, 2011, pp. 145-150.

* cited by examiner

*Primary Examiner* — Tha-O H Bui
(74) *Attorney, Agent, or Firm* — Meyertons, Hood, Kivlin, Kowert & Goetzel, P.C.

(57) ABSTRACT

In some embodiments, a method includes receiving, at a voltage distribution circuit, a power enable signal. In response to the power enable signal, the voltage distribution circuit may connect a word line driver circuit to a bit-cell voltage circuit such that an operating voltage is received at a bit-cell circuit before a word line signal form the word line driver circuit is received at the bit-cell circuit, where the operating voltage is provided by the bit-cell voltage circuit. The method may further include the bit-cell circuit providing the operating voltage along a bit line based on a data stored at the bit-cell circuit and based on the word line signal. In some embodiments, a static noise margin of one or more portions of the bit-cell circuit may be improved. Additionally, in some cases, a wakeup time of the bit-cell circuit may be ignored, resulting in a faster read operation.

20 Claims, 6 Drawing Sheets

BIT-CELL VOLTAGE DISTRIBUTION SYSTEM

BACKGROUND

Technical Field

This disclosure relates generally to a bit-cell voltage distribution system.

Description of the Related Art

In some designs, bit-cells of memory devices may be subject to various forms of unstable read errors. One form of unstable read error at a bit-cell, known as a read disturb error, occurs when a word line is connected to an operating voltage prior to a bit-cell being connected to the operating voltage. If the word line is connected to the operating voltage prior to the bit-cell being connected to the operating voltage, a bit line may be connected to a data value of the bit-cell while the bit-cell is operating using a retention voltage. As a result, a precharge voltage of the bit line may activate a portion of the bit-cell, destroying the data value. Read disturb errors may be made worse by process variations, which may make signals used to connect the word line to the operating voltage propagate faster than signals used to connect the bit-cell to the operating voltage. Additionally, a smaller retention voltage at the bit-cell may similarly make read disturb errors worse (e.g., because the bit-cell make take longer to reach a voltage where the bit line does not destroy the data value).

One way to prevent read disturb errors is to time wakeup signals such that the word line is connected to the operating voltage a particular amount of time (e.g., 500 picoseconds) after the bit-cell has been connected to the operating voltage. However, safety margins associated with such a process may, in many cases, result in additional delay.

SUMMARY

In various embodiments, a bit-cell voltage distribution system is disclosed where a voltage distribution circuit connects a node between a bit-cell voltage circuit and a bit-cell circuit to a word line driver circuit. The word line driver circuit may use an operating voltage to generate a word line signal as part of a read operation for the bit-cell circuit. The operating voltage may be generated by the bit-cell voltage circuit, and in some embodiments, additionally by a word line voltage circuit. As described herein, the bit-cell voltage distribution system may, at least in part, cause the bit-cell circuit to receive the operating voltage before receiving the word line signal. As a result, one or more signals of the system may be provided to the system independent of a wakeup time associated with the bit-cell circuit (because the bit-cell circuit receives the operating voltage before the word line signal). Accordingly, the bit-cell circuit may output a read value faster, as compared to a system that delays one or more control signals by a safety margin time associated with the wakeup time. Additionally, because the bit-cell receives the operating voltage before the word line signal, a static noise margin of the bit-cell may be improved, as compared to the system that delays the one or more control signals by the safety margin time.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "voltage distribution system configured to distribute a voltage" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f)

during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a memory device having eight transistors, the terms "first transistor" and "second transistor" can be used to refer to any two of the eight transistors, and not, for example, just logical transistors 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION

A bit-cell voltage distribution system is described herein where a bit-cell circuit receives an operating voltage before a word line signal such that one or more read disturb errors are less likely to occur, as compared to other systems that include bit-cell circuits. In some embodiments, a bit-cell voltage circuit may output an operating voltage to a bit-cell circuit and to a voltage distribution circuit. The voltage distribution circuit may output the operating voltage to a word line driver, where the operating voltage may be used to generate the word line signal. However, due to one or more delays associated with the voltage distribution circuit, the word line driver, or both, the operating voltage may be received at the bit-cell circuit before the word line signal. When the operating voltage is received at the bit-cell circuit before the word line signal, some potential read disturb errors may be prevented. As a result, one or more safety margins associated with preventing the bit-cell circuit from receiving the operating voltage after receiving the word line signal may not be used. Accordingly, a read response timing associated with the bit-cell circuit may be improved (because the one or more safety margins are not used). Further, a noise margin associated with a read operation of the bit-cell may be reduced when the operating voltage is received at the bit-cell circuit before the word line signal.

In other embodiments, the voltage distribution circuit may provide an operating voltage from a word line voltage circuit to the bit-cell circuit (e.g., concurrently with the bit-cell voltage circuit providing the operating voltage). In other words, the voltage distribution circuit may equalize an output between the word line voltage circuit and the bit-cell voltage circuit. As a result, in some cases, the system may cause the bit-cell circuit to receive the operating voltage before the word line signal such that the one or more read disturb errors are less likely to occur. Accordingly, the read response timing, the noise margin, or both may be improved.

As described herein, a bit-cell circuit may store a data value using a "ground voltage" and a "retention voltage," an "operating voltage," or a value between a retention voltage and an operating voltage. Within the context of the present disclosure, the operating voltage is larger than the retention voltage, and the retention voltage in turn is larger than the ground voltage. As used herein, the "retention voltage" refers to a voltage used to store a data value at a bit-cell circuit between read operations. In contrast, as used herein, the "operating voltage" refers to a voltage used to output the data value as part of a read operation. As further described below, in response to one or more control signals (e.g., received at a bit-cell voltage circuit), the operating voltage may be provided to the bit-cell, causing the voltage at the bit-cell to increase from the retention voltage to the operating voltage.

As used herein, a "ground voltage" refers to a logical low voltage provided to the bit-cell circuit, as compared to the retention voltage and to the "operating voltage." Although the ground voltage may, in some cases, refer to a voltage of 0 volts, in other cases, the ground voltage does not refer to a voltage of 0 volts. Additionally, in some cases, the ground voltage may differ when the operating voltage is provided to the bit-cell circuit, as compared to when the retention voltage is provided to the bit-cell circuit.

As described herein, one or more bit lines may be "precharged." As used herein, "precharging" bit lines refers to a process of providing a precharge voltage to the bit lines in a manner well known in the art such that the bit lines may output a data value from the bit cell circuit more quickly, as compared to bit lines that are not precharged. As described herein, the "precharge voltage" refers to a voltage sufficient to trigger at least some transistors of at least some embodiments of a bit-cell circuit in a manner such that a data value of the bit-cell circuit may be lost.

Some voltages may be described herein as being "equal." This is not intended to imply that the voltages have the same value to an infinite number of decimal places. Instead, as used herein, voltages may be considered to be "equal" when the smaller voltage is within 5% of the larger voltage.

Figure 1:
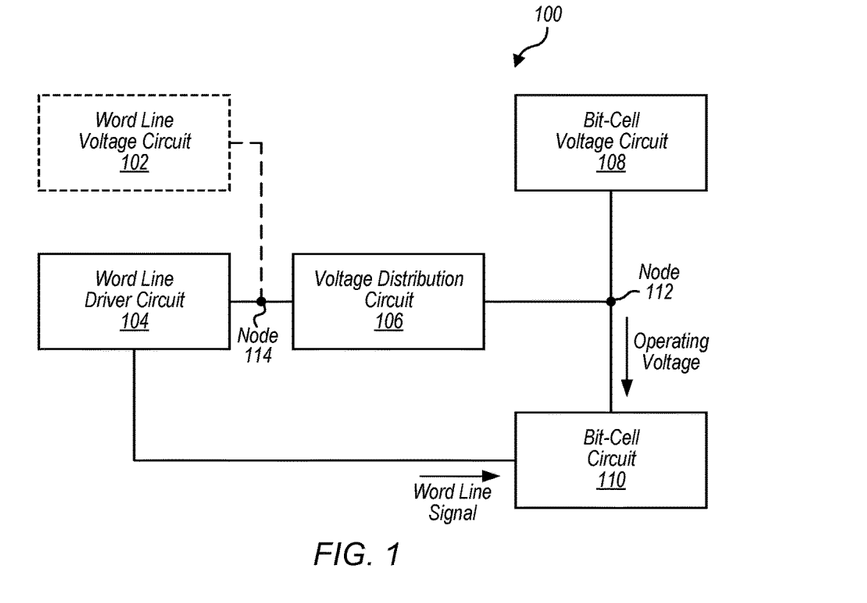
FIG. 1 is a block diagram illustrating one embodiment of an exemplary bit-cell voltage distribution system.

This disclosure initially describes, with reference to FIG. 1, various portions of various embodiments of a bit-cell voltage distribution system. Example processes performed by various embodiments of a bit-cell voltage distribution system are described with reference to FIGS. 2-4. A method performed by an embodiment of a bit-cell voltage distribution system that provides a data value stored at a bit-cell circuit is described with reference to FIG. 5. Finally, an exemplary computing system that includes a bit-cell voltage distribution system is described with reference to FIG. 6.

Turning now to FIG. 1, a block diagram of various embodiments of an exemplary bit-cell voltage distribution system 100 is shown. In the illustrated embodiment, bit-cell voltage distribution system 100 includes word line driver circuit 104, voltage distribution circuit 106, bit-cell voltage circuit 108, bit-cell circuit 110, and node 112. Additionally, in some embodiments, bit-cell voltage distribution system 100 further includes word line voltage circuit 102 and node 114. In some embodiments, one or more repeaters or other logic may be present between one or more of the illustrated circuits.

As illustrated in FIG. 1, as part of a read operation, bit-cell circuit 110 receives an operating voltage from bit-cell voltage circuit 108 and a word line signal from word line driver circuit 104. As noted above, a read disturb error may occur when a bit-cell circuit receives a word line signal before receiving an operating voltage. Some designs have addressed this potential problem by delaying one or more control signals used to generate the word line signal, thus delaying the word line signal. In some instances, the delay introduced by such designs may correspond to the "maximum wakeup time" of the circuit, which, in some designs, represents the worst-case possible delay. But a problem with this approach is that it may sacrifice performance (e.g., access time) in many instances, such as when the worst-case delay is not actually present. The illustrated configuration addresses read disturb errors in another manner, by connecting node 112 to node 114 using voltage distribution circuit 106. As a result, the operating voltage may be distributed in a different manner, as compared to designs that delay the one or more control signals. Further, the illustrated configuration may result in faster bit-cell circuit accesses, as compared to designs that delay the one or more control signals.

Bit-cell voltage circuit 108 may output an operating voltage (e.g., in response to a wake signal). In the illustrated embodiment, bit-cell voltage circuit 108 outputs the operating voltage to node 112, which provides the operating voltage to voltage distribution circuit 106 and to bit-cell circuit 110. Additionally, in some embodiments, bit-cell voltage circuit 108 may output a retention voltage to node 112 or directly to bit-cell circuit 110. In other embodiments, the retention voltage may be output by another device or may be output using another path.

Voltage distribution circuit 106 may connect node 112 to word line driver circuit 104 (e.g., in response to a power enable signal). Accordingly, in the illustrated embodiment, voltage distribution circuit 106 provides the operating voltage from bit-cell voltage circuit 108 to word line driver circuit 104.

Word line driver circuit 104 may receive a word line signal and may output the word line signal in response to receiving the operating voltage. In some embodiments, the word line signal output by word line driver circuit 104 is the same as the word line signal received at word line driver circuit 104. In other embodiments, the word line signal output by word line driver circuit is indicative of (e.g., an inverted version of) the word line signal received at word line driver circuit 104.

Bit-cell circuit 110 may store a data value using a retention voltage, an operating voltage, or both. In the illustrated embodiment, the retention voltage and the operating voltage are received from bit-cell voltage circuit 108 via node 112. In particular, a voltage received at bit-cell circuit 110 may scale from the retention voltage to the operating voltage and vice versa (e.g., based on one or more read operations). Additionally, as described further below with reference to FIGS. 2-4, bit-cell circuit 110 may output the data value using one or more bit lines in response to receiving the operating voltage and based on the word line signal from word line driver circuit 104.

Accordingly, in the illustrated embodiment, the operating voltage is output from bit-cell voltage circuit 108 directly to bit-cell circuit 110. Additionally, the word line signal is received at bit-cell circuit 110 based on the operating voltage being used by (e.g., propagating through) voltage distribution circuit 106 and word line driver circuit 104. In the illustrated embodiment, various components of word line driver circuit 104, voltage distribution circuit 106, and bit-cell circuit 110 may be sized or otherwise configured such that the operating voltage is received at bit-cell circuit 110 before the word line signal. As a result, as described further below with reference to FIG. 2, a potential read disturb error at bit-cell circuit 110 associated with word line signal being received before the operating voltage may be avoided. Accordingly, one or more other measures ordinarily used to prevent the potential read disturb error (e.g., coordinating one or more control signals) may be unnecessary and may not be used. As a result, bit-cell circuit 110 may output the data value more quickly, as compared to a system where other measures are used to prevent the potential read disturb error. Additionally, a static noise margin of bit-cell circuit 110 associated with an amount of noise bit-cell circuit 110 can withstand (e.g., as part of one or more write operations, one or more read operations, or both) may be improved.

In some embodiments, as further described below with reference to FIG. 3, bit-cell voltage distribution system 100 includes word line voltage circuit 102, connected at node 114 between voltage distribution circuit 106 and word line driver circuit 104. Word line voltage circuit 102 may output the operating voltage to node 114 in response to a second power enable signal. Accordingly, in some embodiments, both bit-cell voltage circuit 108 and word line voltage circuit 102 may output the operating voltage. As a result, voltage distribution circuit 106 may equalize the voltage between node 114 and node 112 (i.e., current may be passed through voltage distribution circuit 106 from node 114 to node 112 or vice versa). Additionally, bit-cell circuit 110, word line driver circuit 104, or both may receive the operating voltage from word line voltage circuit 102. However, in the illustrated embodiment, bit-cell voltage circuit 108, word line voltage circuit 102, and voltage distribution circuit 106 may be controlled such that bit-cell circuit 110 receives the operating voltage (from word line voltage circuit 102, bit-cell voltage circuit 108, or both) before receiving the word line signal from word line driver circuit 104. Because voltage distribution circuit 106 connects node 114 to node 112, one or more timing restraints on bit-cell voltage circuit 108, word line voltage circuit 102, or both may be relaxed, as compared to a system that does not include voltage distribution circuit 106 and prevents the potential read disturb error at bit-cell circuit 110.

Figure 2:
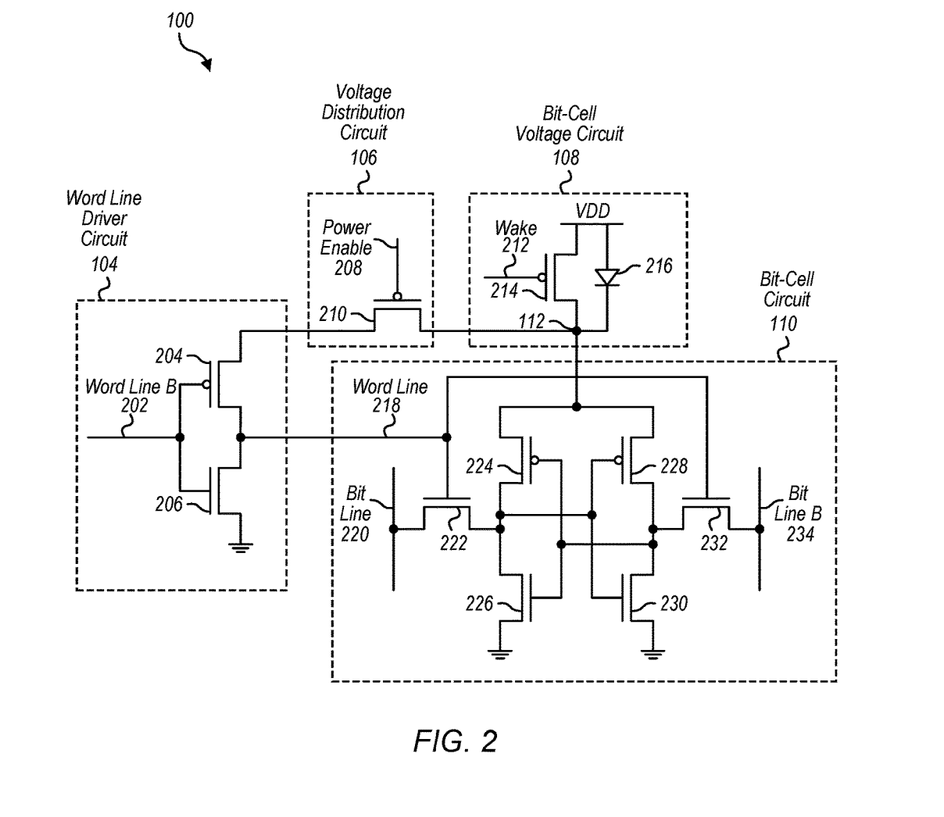
FIG. 2 is a block diagram illustrating components of a first embodiment of an exemplary bit-cell voltage distribution system.

Turning now to FIG. 2, a block diagram illustrating components of a first embodiment of bit-cell voltage distribution system 100 are shown. In the illustrated embodiment, word line driver circuit 104 includes transistor 204, and transistor 206. Voltage distribution circuit 106 includes transistor 210. Bit-cell voltage circuit 108 includes transistor 214 and diode 216. Bit-cell circuit 110 includes bit line 220, transistors 222-232, and bit line bar 234. The illustrated embodiment does not include word line voltage circuit 102.

Although a particular arrangement of circuit components is illustrated with respect to FIG. 2, as further described below with reference to FIG. 4, other functionally similar arrangements of circuits (e.g., using transmission gates instead of single transistors or only using p-channel metal-oxide-semiconductor field-effect transistors) are contemplated.

As described above, bit-cell voltage circuit 108 may output an operating voltage and may output a retention voltage. In particular, in the illustrated embodiment, in response to receiving wake signal 212 at transistor 214, transistor 214 may provide the operating voltage from a voltage source (e.g., voltage source VDD) to node 112. Additionally, diode 216 may be configured such that diode 216 provides a sufficient amount of resistance to output the retention voltage (as opposed to the operating voltage) to node 112. In the illustrated embodiment, diode 216 outputs the retention voltage whenever node 112 has a voltage value lower than the retention voltage. However, in other embodiments, diode 216 may output the retention voltage in response to a signal that indicates a request to output the retention voltage.

As described above, voltage distribution circuit 106 may connect node 112 to word line driver circuit 104. In particular, in the illustrated embodiment, in response to receiving power enable signal 208 at transistor 210, transistor 210 may connect node 112 to word line driver circuit 104. As a result, when bit-cell voltage circuit 108 outputs the operating voltage, the operating voltage may be provided to word line driver circuit 104 via transistor 210 of voltage distribution circuit 106 based on power enable signal 208.

As described above, word line driver circuit 104 may receive a word line signal and may output the word line signal in response to receiving the operating voltage. In particular, in the illustrated embodiment, in response to receiving the operating voltage from voltage distribution circuit 106, transistor 204 and transistor 206 may invert word line bar signal 202 to output word line signal 218. In some cases, word line signal 218 may indicate that an associated word line is not active (e.g., by providing a ground voltage to bit-cell circuit 110) prior to the operating voltage being received at word line driver circuit 104, regardless of a value of word line bar signal 202.

As described above, bit-cell circuit 110 may store a data value using a retention voltage, an operating voltage, or both, and may output the data value using one or more bit lines. In particular, in the illustrated embodiment, bit-cell circuit 110 includes six transistors (transistors 222-232) arranged in a six transistor memory cell, including cross-coupled inverters formed by transistors 224 and 226 and by transistors 228 and 230, respectively. The retention voltage received from bit-cell voltage circuit 108 via diode 216 may be sufficient to trigger transistors 224-230 such that a data value and an inverse of the data value may be stored. Similarly, the operating voltage may be sufficient to trigger transistors 224-230 such that the data value and the inverse of the data value may be stored.

Transistor 222 may, in response to word line signal 218, connect the data value to bit line 220. Similarly, transistor 232 may, in response to word line signal 218, connect the data value to bit line bar 234. In some cases, bit line 220 and bit line bar 234 may be precharged such that if the data value is stored at transistors 224-230 using the retention voltage when transistors 222 and 232 connect transistors 224-230 to bit line 220 and bit line bar 234, respectively, the data value may be destroyed. For example, bit line 220 and bit line bar 234 may be precharged to the operating voltage. Accordingly, bit-cell voltage distribution system 100 may be designed such that the operating voltage is received at transistors 224 and 228 prior to word line signal 218 (generated based on the operating voltage) being received at transistors 222 and 232 (i.e., indicating that an associated word line is active). In some embodiments, at least one of transistor 204, transistor 222, and transistor 232, may be configured such that word line driver circuit 104 receiving the retention voltage at transistor 204 does not cause a sufficient amount of voltage to be transferred to transistors 224-230 to destroy the data value.

As used herein, a "wakeup time" refers to an amount of time after a wake signal (e.g., wake signal 212) is sent before a voltage passed through transistors storing a data value at a bit cell circuit (e.g., transistors 224-230) reaches a threshold percentage (e.g., 95%) of the operating voltage. The threshold percentage may be determined based on several factors known in the art, such as a size of a range of potential process variations associated with the transistors storing the data value and a difference between various voltages of the system (e.g., the retention voltage, the operating voltage, and/or the precharge voltage). As described herein, a "maximum wakeup time" refers to an amount of time after a wake signal is sent to a voltage circuit before a voltage passed through transistors storing a value at a bit cell circuit reaches an operating voltage, accounting for worst-case design process variations.

Because bit-cell voltage distribution system 100 is designed such that the operating voltage is received at bit-cell circuit 110 before word line signal 218 is received at bit-cell circuit 110, power enable signal 208 may be triggered independent of a wakeup time of bit-cell circuit. For example, power enable signal 208 may be triggered prior to wake signal 212 being received, and, as discussed above, the data value may not be destroyed based on the retention voltage. Additionally, when wake signal 212 is received at bit-cell voltage circuit 108, because bit-cell circuit 110 receives the operating voltage before the word line signal 218, the data value is not destroyed. Further, a static noise margin, indicative of an amount of noise transistors 224-230 can withstand without compromising the data value, may be improved, as compared to a system that does not include voltage distribution circuit 106.

Figure 3:
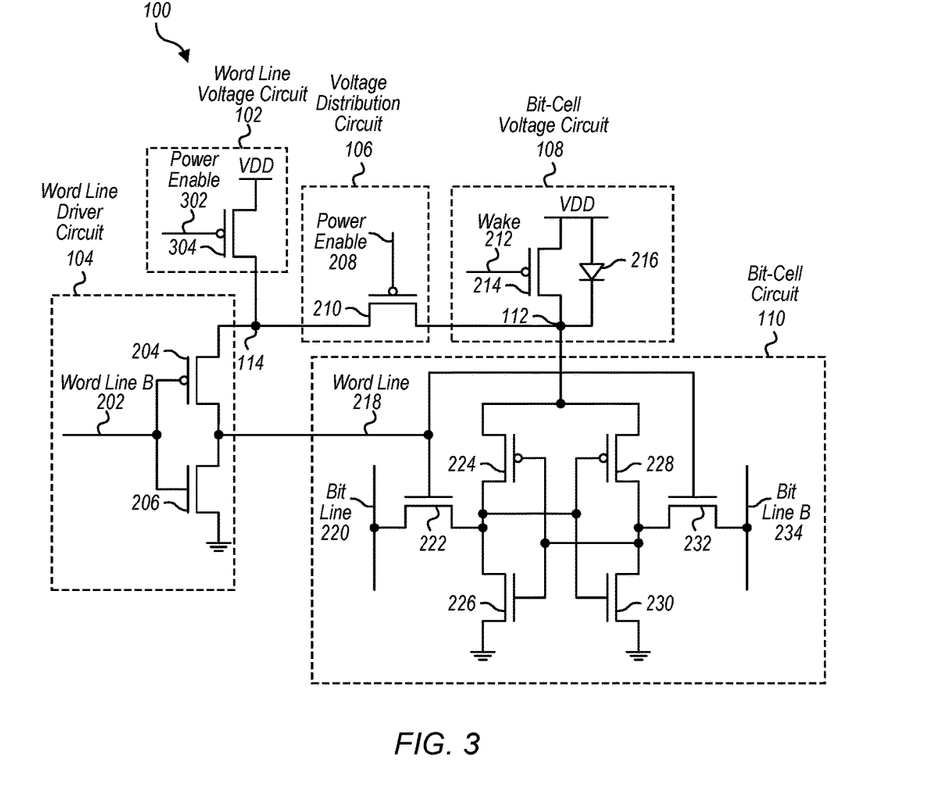
FIG. 3 is a block diagram illustrating components of a second embodiment of an exemplary bit-cell voltage distribution system.

Turning now to FIG. 3, a block diagram illustrating components of a second embodiment of bit-cell voltage distribution system 100 are shown. In the illustrated embodiment, word line voltage circuit 102 includes transistor 304. Word line driver circuit 104 includes transistor 204, and transistor 206. Voltage distribution circuit 106 includes transistor 210. Bit-cell voltage circuit 108 includes transistor 214 and diode 216. Bit-cell circuit 110 includes bit line 220, transistors 222-232, and bit line bar 234. Although a particular arrangement of circuit components is illustrated with respect to FIG. 3, other functionally similar arrangements of circuits (e.g., using transmission gates instead of single transistors or only using p-channel metal-oxide-semiconductor field-effect transistors) are contemplated.

In the illustrated embodiment, bit-cell voltage circuit 108, word line driver circuit 104, and bit-cell circuit 110 function as described above with reference to FIG. 2. As described above, word line voltage circuit 102 may output the operating voltage to node 114. In particular, in response to power enable signal 302, transistor 304 may provide the operating voltage from a voltage source (e.g., voltage source VDD) to node 114. Voltage distribution circuit 106 may, in response to power enable signal 208, equalize voltages between node 112 and node 114.

In some cases, the operating voltage from word line voltage circuit 102 may reduce a wakeup time of bit-cell circuit 110 (because the operating voltage is provided from an additional source). As an example, wake signal 212, power enable signal 208, and power enable signal 302 may be controlled such that bit-cell circuit 110 receives the operating voltage before receiving the word line signal 218. However, if power enable signal 208 is sent before power enable signal 302, a timing restraint associated with power enable signal 302 and wake signal 212 may be relaxed, as compared to a system that does not include voltage distribution circuit 106, because voltage distribution circuit 106 equalizes the voltages between node 112 and node 114. Accordingly, in some cases, bit-cell circuit 110 may output the data value on bit line 220 and bit line bar 234 more quickly, as compared to a system that does not include voltage distribution circuit 106. Additionally, transistors 224-230 may have a lower static noise ratio, as compared to a system that does not include voltage distribution circuit 106.

Figure 4:
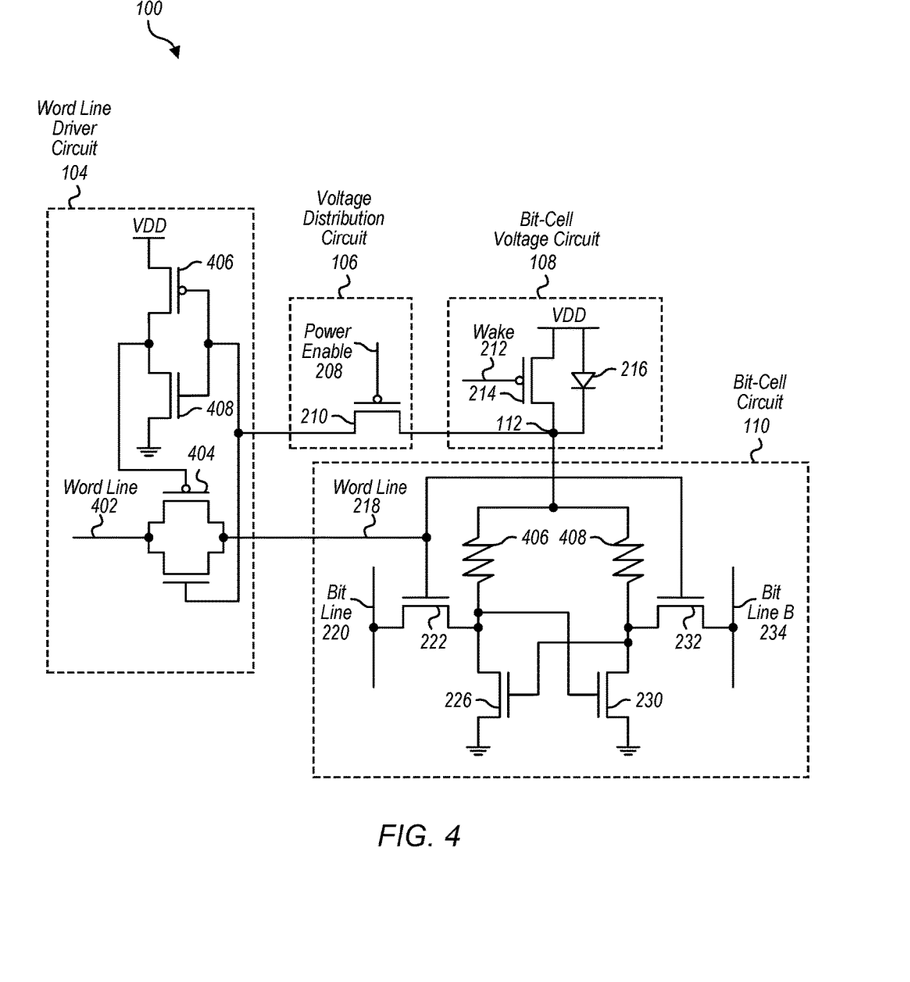
FIG. 4 is a block diagram illustrating components of a third embodiment of an exemplary bit-cell voltage distribution system.

Turning now to FIG. 4, a block diagram illustrating components of a third embodiment of bit-cell voltage distribution system 100 are shown. In the illustrated embodiment, word line driver circuit 104 includes transmission gate 404 and transistors 406 and 408. Voltage distribution circuit 106 includes transistor 210. Bit-cell voltage circuit 108 includes transistor 214 and diode 216. Bit-cell circuit 110 includes bit line 220, transistors 222, 226, 230, and 232, and bit line bar 234. The illustrated embodiment does not include word line voltage circuit 102.

As compared to the first embodiment of bit-cell voltage distribution system 100 illustrated with reference to FIG. 2, word line bar signal 202 and the inverter formed by transistors 204 and 206 of FIG. 2 are replaced by word line signal 402, transmission gate 404, and an inverter formed by transistors 406 and 408. In the illustrated embodiment, voltage distribution circuit 106 is directly connected to the n-channel metal-oxide-semiconductor field-effect transistor (NMOS) gate of transmission gate 404 and is connected to the p-channel metal-oxide-semiconductor field-effect transistor (PMOS) gate of transmission gate via the inverter. Accordingly, transmission gate 404 may connect word line 402 to word line 218 based on whether a voltage is output from voltage distribution circuit 106. Additionally, the six-transistor static random access memory (SRAM) cell formed by transistors 224-230 is replaced by a four-transistor resistive SRAM cell formed by resistors 406 and 408 and by transistors 226 and 230.

As known in the art, the illustrated systems may function similarly other than various tradeoffs (e.g., power consumption, area, timing, variety of signals used, etc.) between the design presented above with respect to FIG. 2 and the instant design. However, the system of FIG. 4 is illustrated herein to show that many variations of the designs presented herein may be used in conjunction with voltage distribution circuit 106. Although alternative designs are not presented for voltage distribution circuit 106 and bit-cell voltage circuit 108, in other embodiments, alternative designs for voltage distribution circuit 106, bit-cell voltage circuit 108, or both may be used in addition to or instead of various alternative designs presented herein.

Figure 5:
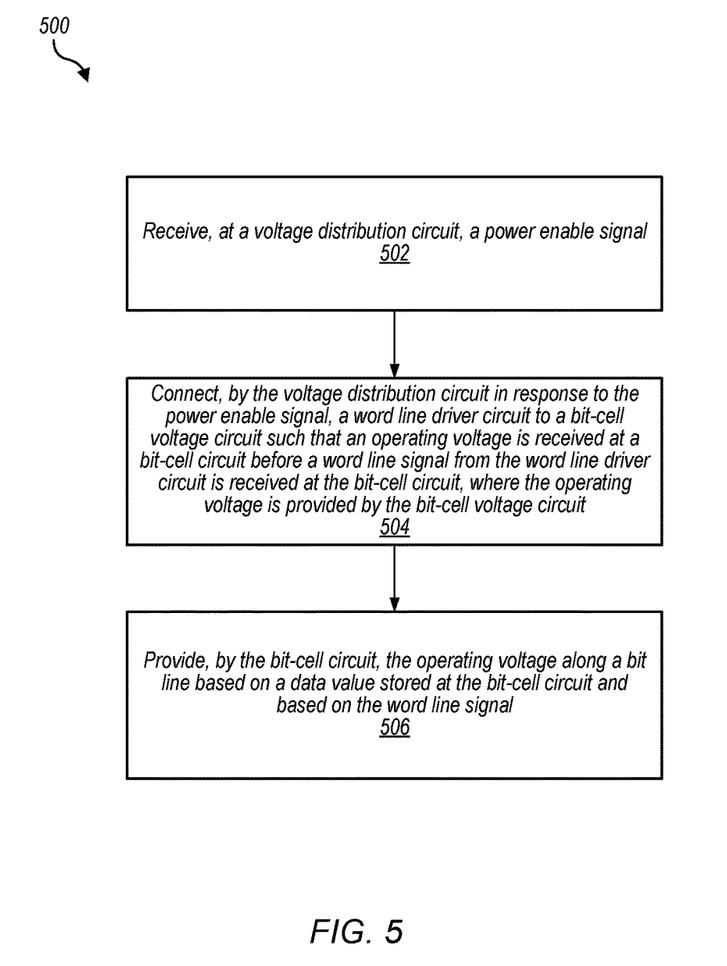
FIG. 5 is a flow diagram illustrating one embodiment of a method of providing a data value using a bit-cell voltage distribution system.

Referring now to FIG. 5, a flow diagram of a method 500 is depicted. Method 500 is an embodiment of a method of providing a data value using a bit-cell voltage distribution system.

At 502, method 500 includes receiving, at a voltage distribution circuit, a power enable signal. For example, method 500 may include voltage distribution circuit 106 of FIG. 2 receiving power enable signal 208.

At 504, method 500 includes connecting, by the voltage distribution circuit in response to the power enable signal, a word line driver circuit to a bit-cell voltage circuit such that an operating voltage is received at a bit-cell circuit before a word line signal from the word line driver circuit is received at the bit cell circuit. The operating voltage may be provided by the bit-cell voltage circuit. For example, voltage distribution circuit 106 may connect word line driver circuit 104 to bit-cell voltage circuit 108 such that the operating voltage VDD from bit-cell voltage circuit 108 is received at bit-cell circuit 110 before word line signal 218 is received at bit-cell circuit.

At 506, method 500 includes providing, by the bit-cell circuit, the operating voltage along a bit line based on a data value stored at the bit-cell circuit and based on the word line signal. For example, method 500 includes bit-cell circuit 110 providing the operating voltage along bit line 220 or along bit line bar 234 based on a data value stored using transistors 224-230 and based on the word line signal 218. Accordingly, a method of providing a data value using a bit-cell voltage distribution system is depicted.

As noted above, in various embodiments, bit-cell voltage distribution system 100 may include word line voltage circuit 102. Accordingly, in some embodiments, connecting the word line driver circuit to the bit-cell voltage circuit at 504 may further include connecting the bit-cell circuit to a word line voltage circuit. The operating voltage may be further provided by the word line voltage circuit. For example, when voltage distribution circuit 106 connects word line driver circuit 104 to bit-cell voltage circuit 108, bit-cell circuit 110 may be additionally connected to word line voltage circuit 102. Word line voltage circuit 102 may provide the operating voltage in addition to bit-cell voltage circuit 108.

Figure 6:
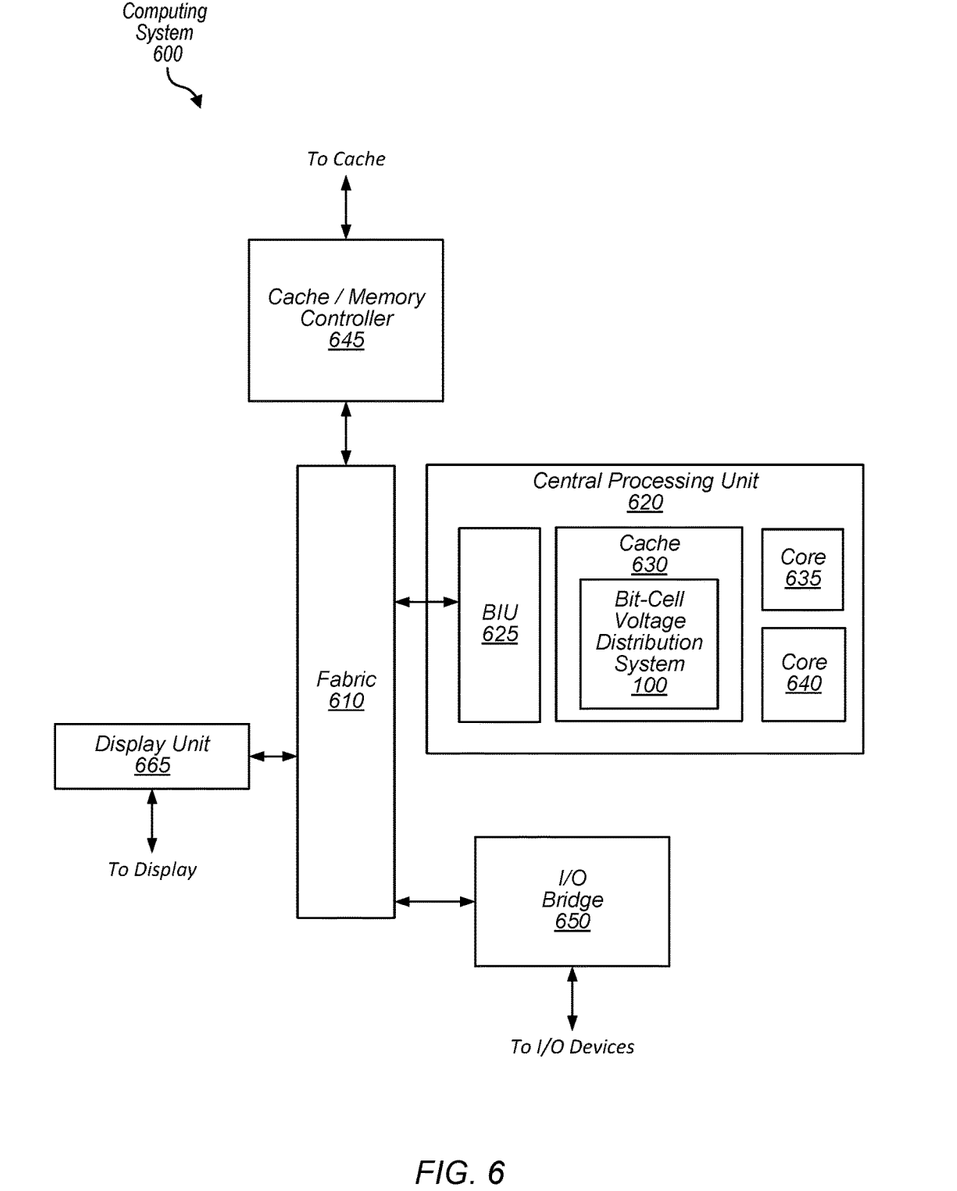
FIG. 6 is block diagram illustrating an embodiment of an exemplary computing system that includes at least a portion of an exemplary register allocation system.

Turning next to FIG. 6, a block diagram illustrating an exemplary embodiment of a computing system 600 that includes at least a portion of an exemplary register allocation system. Computing system 600 includes various circuits described above with reference to FIGS. 1-5. Computing system 600 may further include any variations or modifications described previously with reference to FIGS. 1-5. In some embodiments, some or all elements of the computing system 600 may be included within a system on a chip (SoC). In some embodiments, computing system 600 is included in a mobile device. Accordingly, in at least some embodiments, area, timing, and power consumption of computing system 600 may be important design considerations. In the illustrated embodiment, computing system 600 includes fabric 610, central processing unit (CPU) 620, input/output (I/O) bridge 650, cache/memory controller 645, and display unit 665. Although the computing system 600 illustrates central processing unit 620 as being connected to fabric 610 as a sole central processing unit of the computing system 600, in other embodiments, central processing unit 620 may be connected to or included in other components of the computing system 600 and other central processing units may be present. Additionally or alternatively, the computing system 600 may include multiple central processing units 620. The multiple central processing units 620 may correspond to different embodiments or to the same embodiment.

Fabric 610 may include various interconnects, buses, MUXes, controllers, etc., and may be configured to facilitate communication between various elements of computing system 600. In some embodiments, portions of fabric 610 are configured to implement various different communication protocols. In other embodiments, fabric 610 implements a single communication protocol and elements coupled to fabric 610 may convert from the single communication protocol to other communication protocols internally.

In the illustrated embodiment, central processing unit 620 includes bus interface unit (BIU) 625, cache 630, and cores 635 and 640. Cache 630 includes bit-cell voltage distribution system 100, which may correspond to any of the embodiments described above with reference to FIGS. 1-5. In various embodiments, central processing unit 620 includes various numbers of cores and/or caches. For example, central processing unit 620 may include 1, 2, or 4 processor cores, or any other suitable number. In some embodiments, cores 635 and/or 640 include internal instruction and/or data caches. In some embodiments, a coherency unit (not shown) in fabric 610, cache 630, or elsewhere in computing system 600 is configured to maintain coherency between various caches of computing system 600. BIU 625 may be configured to manage communication between central processing unit 620 and other elements of computing system 600. Processor cores 635 and 640 may be configured to execute instructions of a particular instruction set architecture (ISA), which may include operating system instructions and user application instructions. Although the computing system 600 illustrates only a single instance of bit-cell voltage distribution system 100 located within cache 630, in other embodiments, bit-cell voltage distribution system 100 may be located elsewhere (e.g., within a cache attached to cache/memory controller 645) or in multiple locations.

Cache/memory controller 645 may be configured to manage transfer of data between fabric 610 and one or more caches and/or memories (e.g., non-transitory computer readable mediums). For example, cache/memory controller 645 may be coupled to an L3 cache, which may, in turn, be coupled to a system memory. In other embodiments, cache/memory controller 645 is directly coupled to a memory. In some embodiments, the cache/memory controller 645 includes one or more internal caches. In some embodiments, the cache/memory controller 645 may include or be coupled to one or more caches and/or memories that include instructions that, when executed by one or more processors, cause the processor, processors, or cores to initiate or perform some or all of the processes described above with reference to FIGS. 1-5. As noted above, one or more of the caches may include bit-cell voltage distribution system 100.

As used herein, the term "coupled to" may indicate one or more connections between elements, and a coupling may include intervening elements. For example, in FIG. 6, display unit 665 may be described as "coupled to" central processing unit 620 through fabric 610. In contrast, in the illustrated embodiment of FIG. 6, display unit 665 is "directly coupled" to fabric 610 because there are no intervening elements.

Display unit 665 may be configured to read data from a frame buffer and provide a stream of pixel values for display. Display unit 665 may be configured as a display pipeline in some embodiments. Additionally, display unit 665 may be configured to blend multiple frames to produce an output frame. Further, display unit 665 may include one or more interfaces (e.g., MIPI® or embedded display port (eDP)) for coupling to a user display (e.g., a touchscreen or an external display).

I/O bridge 650 may include various elements configured to implement: universal serial bus (USB) communications, security, audio, and/or low-power always-on functionality, for example. I/O bridge 650 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 600 via I/O bridge 650. In some embodiments, central processing unit 620 may be coupled to computing system 600 via I/O bridge 650.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a bit-cell voltage circuit configured to output an operating voltage in response to a wake signal being received by at least a portion of the bit-cell voltage circuit;
   a word line driver circuit configured to:
      receive a word line signal; and
      output the word line signal in response to receiving the operating voltage from the bit-cell voltage circuit;
   a bit-cell circuit configured to:
      store a data value using a retention voltage; and
      output the data value on one or more bit lines in response to receiving the operating voltage from the bit-cell voltage circuit and based on the word line signal; and
   a voltage distribution circuit configured to connect, based on a power enable signal, an output of the bit-cell voltage circuit to the word line driver circuit such that the bit-cell circuit receives the operating voltage prior to receiving the word line signal.

2. The apparatus of claim 1, wherein, to output the word line signal, the word line driver circuit is configured to invert the word line signal using the operating voltage.

3. The apparatus of claim 1, wherein the bit-cell voltage circuit further comprises a diode configured to provide the retention voltage to the bit-cell circuit.

4. The apparatus of claim 1, wherein the word line driver circuit is associated with a plurality of bit-cell circuits including the bit-cell circuit.

5. The apparatus of claim 1, wherein the bit-cell circuit is a six-transistor static random access memory (SRAM) bit-cell.

6. A method, comprising:
   receiving, at a voltage distribution circuit, a power enable signal;
   connecting, by the voltage distribution circuit in response to the power enable signal, a word line driver circuit to a bit-cell voltage circuit such that an operating voltage is received at a bit-cell circuit before a word line signal from the word line driver circuit is received at the bit-cell circuit, wherein the operating voltage is provided by the bit-cell voltage circuit; and providing, by the bit-cell circuit, the operating voltage along a bit line based on a data value stored at the bit-cell circuit and based on the word line signal.

7. The method of claim 6, wherein connecting the word line driver circuit to the bit-cell voltage circuit further comprises connecting the bit-cell circuit to a word line voltage circuit, wherein the operating voltage is further provided by the word line voltage circuit.

8. The method of claim 7, wherein connecting the word line driver circuit to the bit-cell voltage circuit comprises issuing the power enable signal at a timing relative to a wake signal for the bit-cell voltage circuit and to a second power enable signal for the word line voltage circuit such that the operating voltage is received at the word line driver circuit subsequent to being received at the bit-cell circuit.

9. The method of claim 6, further comprising, prior to the operating voltage being received at the bit-cell circuit, preserving, at the bit-cell circuit, the data value using a retention voltage, wherein the operating voltage is larger than the retention voltage.

10. The method of claim 9, wherein the retention voltage is received from the bit-cell voltage circuit via a diode of the bit-cell voltage circuit.

11. The method of claim 6, wherein providing the operating voltage along the bit line comprises:
connecting the bit line to the operating voltage; and
connecting a second bit line to a ground voltage.

12. The method of claim 11, further comprising, prior to providing the operating voltage along the bit line, precharging the bit line and the second bit line to a precharge voltage.

13. The method of claim 12, wherein the precharge voltage is equal to the operating voltage.

14. The method of claim 6, wherein the operating voltage is provided by the bit-cell voltage circuit in response to a wake signal associated with the bit-cell circuit.

15. The method of claim 6, wherein the bit-cell circuit has a maximum wakeup time, and wherein the bit-cell circuit provides the operating voltage before the maximum wakeup time.

16. An apparatus, comprising:
a bit-cell voltage circuit configured to output an operating voltage in response to a wake signal being received by at least a portion of the bit-cell voltage circuit;
a word line voltage circuit configured to output the operating voltage in response to a second power enable signal;
a word line driver circuit configured to:
receive a word line signal; and
output the word line signal in response to receiving the operating voltage;
a bit-cell circuit configured to:
store a data value using a retention voltage; and
output the data value on one or more bit lines in response to receiving the operating voltage and based on the word line signal; and
a voltage distribution circuit coupled to the bit-cell voltage circuit and to the bit-cell circuit at a first node, wherein the voltage distribution circuit is further coupled to the word line driver circuit and to the word line voltage circuit at a second node, and wherein the voltage distribution circuit is configured to connect, based on a first power enable signal, the first node to the second node such that the bit-cell circuit receives the operating voltage prior to receiving the word line signal.

17. The apparatus of claim 16, wherein the voltage distribution circuit is configured to provide the operating voltage from the bit-cell voltage circuit to the word line driver circuit.

18. The apparatus of claim 16, wherein the voltage distribution circuit is configured to provide the operating voltage from the word line voltage circuit to the bit-cell circuit.

19. The apparatus of claim 16, wherein the bit-cell voltage circuit is further configured to output the retention voltage.

20. The apparatus of claim 16, wherein the one or more bit lines are configured to be precharged to a precharge voltage that exceeds the retention voltage.

\* \* \* \* \*